(12) United States Patent
Hebert et al.

(10) Patent No.: US 9,666,700 B2
(45) Date of Patent: May 30, 2017

(54) VERTICAL BIPOLAR JUNCTION TRANSISTOR AND MANUFACTURING METHOD THEREOF

(71) Applicant: MagnaChip Semiconductor, Ltd., Cheongju-si (KR)

(72) Inventors: Francois Hebert, San Mateo, CA (US); Yon Sup Pang, Cheonan-si (KR); Seong Min Cho, Cheongju-si (KR); Ju Ho Kim, Daejeon (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 53 days.

(21) Appl. No.: 14/525,545

(22) Filed: Oct. 28, 2014

(65) Prior Publication Data

US 2015/0243770 A1     Aug. 27, 2015

(30) Foreign Application Priority Data

Feb. 21, 2014    (KR) ........................ 10-2014-0020851

(51) Int. Cl.
*H01L 29/732*     (2006.01)
*H01L 29/73*     (2006.01)
(Continued)

(52) U.S. Cl.
CPC ........ *H01L 29/732* (2013.01); *H01L 29/0821* (2013.01); *H01L 29/10* (2013.01);
(Continued)

(58) Field of Classification Search
CPC . H01L 29/0804; H01L 29/08; H01L 29/0821; H01L 29/41708; H01L 29/66234;
(Continued)

(56) References Cited

U.S. PATENT DOCUMENTS 3,569,800 A   *   3/1971   Collins ................... H01L 21/74
                                                                   257/542
4,007,474 A      2/1977   Yagi et al.
(Continued)

OTHER PUBLICATIONS

Andreini, Antonio et al. "A New Integrated Silicon Gate Technology Combining Bipolar Linear, CMOS Logic, and DMOS Power Parts." *Electron Devices, IEEE Transactions on* vol. ED-33 No. 12 (Dec. 1986): pp. 2025-2030.

*Primary Examiner* — Daniel Whalen
*Assistant Examiner* — Suberr Chi
(74) *Attorney, Agent, or Firm* — NSIP Law

(57) ABSTRACT

The present disclosure relates to a vertical bipolar junction transistor. A vertical bipolar junction transistor includes a high concentration doping region emitter terminal disposed on a semiconductor substrate; a high concentration doping region collector terminal disposed on a semiconductor substrate; a high concentration doping region base terminal disposed between the emitter terminal and the collector terminal; a drift region having a first doping concentration surrounding the emitter terminal and being deeper than either the base terminal or the collector terminal; a base layer disposed below the drift region; a collector layer in contact with the base layer, the collector layer having a second doping concentration higher than the first doping concentration. The manufacturing cost of the vertical bipolar junction transistor can be lowered and a current gain can be elevated using a low-cost BCD process.

21 Claims, 5 Drawing Sheets

(51) Int. Cl.
    *H01L 29/423*     (2006.01)
    *H01L 29/66*     (2006.01)
    *H01L 29/08*     (2006.01)
    *H01L 29/10*     (2006.01)
    *H01L 29/78*     (2006.01)
    *H01L 21/8249*     (2006.01)

(52) U.S. Cl.
    CPC ...... *H01L 29/423* (2013.01); *H01L 29/66272* (2013.01); *H01L 29/7302* (2013.01); *H01L 21/8249* (2013.01); *H01L 29/1083* (2013.01); *H01L 29/1095* (2013.01); *H01L 29/7816* (2013.01); *H01L 29/7835* (2013.01)

(58) Field of Classification Search
    CPC   H01L 21/0257; H01L 29/732; H01L 29/7302
    See application file for complete search history.

(56) References Cited

U.S. PATENT DOCUMENTS

| | | | |
|---|---|---|---|
| 4,344,081 A * | 8/1982 | Pao ................... | H01L 27/0716 257/378 |
| 4,458,158 A * | 7/1984 | Mayrand .................. | 326/101 |
| 4,639,761 A * | 1/1987 | Singer ................... | H01L 21/74 257/336 |
| 5,814,538 A * | 9/1998 | Kim et al. ................ | 438/153 |
| 9,117,845 B2 * | 8/2015 | Nassar | |
| 2003/0155631 A1 * | 8/2003 | Nelle et al. ............... | 257/565 |
| 2006/0118881 A1 * | 6/2006 | Ren et al. ................ | 257/370 |
| 2013/0234277 A1 * | 9/2013 | Negoro et al. ............ | 257/443 |
| 2014/0152349 A1 * | 6/2014 | Hung .................. | H01L 27/0259 257/487 |

\* cited by examiner

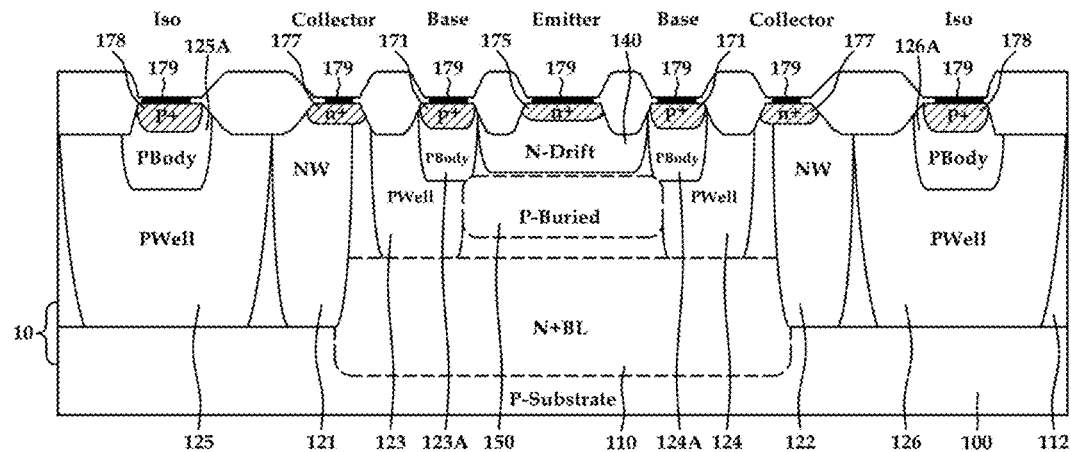
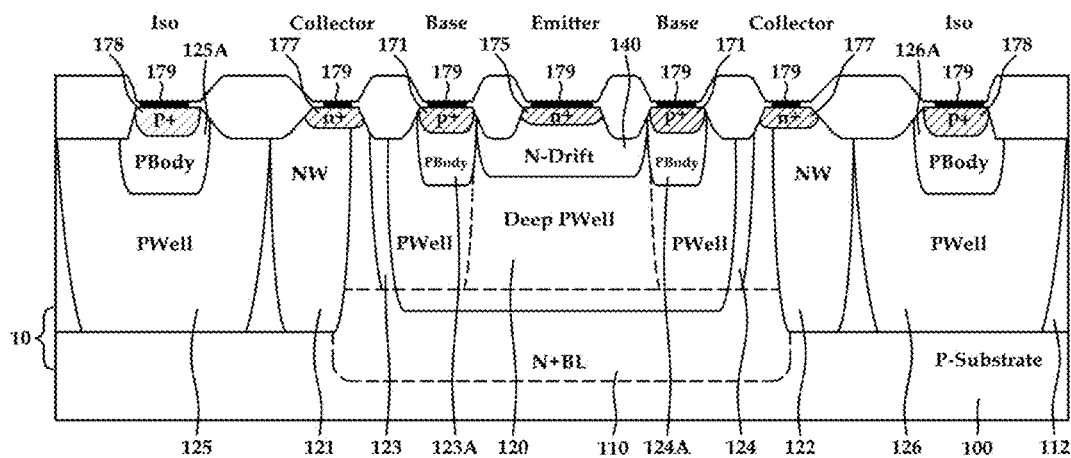

VERTICAL BIPOLAR JUNCTION TRANSISTOR AND MANUFACTURING METHOD THEREOF

CROSS-REFERENCE TO RELATED APPLICATIONS

This application claims the benefit under 35 U.S.C. §119 (a) of Korean Patent Application No. 10-2014-0020851, filed on Feb. 21, 2014, in the Korean Intellectual Property Office, the entire disclosure of which is incorporated herein by reference for all purposes.

BACKGROUND

Field

The following description relates to a vertical bipolar junction transistor device and a manufacturing method thereof. The following description concerns a structure of a vertical bipolar junction transistor that lowers the manufacturing cost and that can raise a current gain by using of a low-cost Bipolar-CMOS (Complementary Metal Oxide Semiconductor)-DMOS (Double Diffused Metal Oxide Semiconductor) (BCD) process.

Description of Related Art

A bipolar junction transistor having a high current gain is widely used in many kinds of analogue circuits such as an amplifier, a comparator, and a bandgap reference circuit. In manufacturing a bipolar junction transistor, it is beneficial to not only raise a current gain but also to reduce the manufacturing cost. In the following description, a method that uses a Bipolar-CMOS-DMOS (BCD) process has also been developed to satisfy these requirements.

The BCD process is a technology configured to incorporate many devices such as, for example, n-channel lateral DMOS (nLDMOS), p-channel lateral double diffused MOS (pLDMOS), Isolated CMOS, n-channel DMOS (nDMOS), p-channel DMOS (pDMOS), Vertical NPN, Lateral PNP, and Schottky diode together, in one semiconductor substrate.

However, using the present BCD process, when adding additional process steps to elevate the current gain of the bipolar junction transistor, the manufacturing cost increases or a satisfactory level of current gain cannot be acquired.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a vertical bipolar junction transistor including a high concentration doping region emitter terminal disposed on a semiconductor substrate, a high concentration doping region collector terminal disposed on a semiconductor substrate, a high concentration doping region base terminal disposed between the emitter terminal and the collector terminal, a drift region having a first doping concentration surrounding the emitter terminal and being deeper than either the base terminal or the collector terminal, a base layer disposed below the drift region, and a collector layer in contact with the base layer, the collector layer having a second doping concentration higher than the first doping concentration.

The vertical bipolar junction transistor may include a body region surrounding the base terminal, and a well ring of a first conductive type surrounding the collector terminal and extending to the collector layer.

The base layer may be self-aligned with the drift region.

The base layer may include a buried layer of a second conductive type and a deep well of a second conductive type.

The deep well of second conductive type may be disposed on a buried layer of first conductive type, surrounds the base layer, and is in contact with the body region.

The collector layer may extend from a surface of the semiconductor substrate and surrounds sides and bottom surfaces of the base layer, the drift region, and the body region.

The vertical bipolar junction transistor may include a well of a second conductive type in contact with the base layer, the body region, and the collector layer.

The base layer may extend from a surface of the semiconductor substrate and surrounds sides and bottom surface of the drift region.

The semiconductor substrate may include a semiconductor layer and an epitaxial layer disposed on the semiconductor layer.

The collector layer may be disposed at a boundary surface of the semiconductor layer and the epitaxial layer.

A current gain ($\beta$) may be equal to or more than 100 when a base-emitter voltage (Vbe) is between 0.4 V-0.7 V.

The emitter terminal and the drift region may form an emitter region, the base terminal, the body region and the base layer may form a base region, and the collector terminal, the well ring of first conductive type, and the buried layer of first conductive type may form a collector region.

In another general aspect, there is provided a manufacturing method of a vertical bipolar junction transistor including forming an high concentration doping region emitter terminal and a high concentration doping region collector terminal on a semiconductor substrate, forming a high concentration doping region base terminal between the emitter terminal and the collector terminal, forming a drift region having a first doping concentration that surrounds the emitter terminal and is deeper than either the base terminal or the collector terminal, forming a base layer below the drift region, and forming a collector layer in contact with the base layer, the collector layer having a second doping concentration higher than the first doping concentration, wherein the drift region is self-aligned with the base layer.

The vertical bipolar junction transistor may be formed to be aligned with a DMOS structure in the substrate.

The drift region may be identical to a concentration profile of a drift region of the DMOS structure.

In another general aspect, there is provided a vertical bipolar junction transistor including a high concentration doping region emitter terminal disposed on a semiconductor substrate, a high concentration doping region collector terminal disposed on a semiconductor substrate, a high concentration doping region base terminal disposed between the emitter terminal and the collector terminal, a drift region having a first doping concentration surrounding the emitter terminal and being deeper than either the base terminal or the collector terminal, a base layer comprising a buried layer of a second conductive type and a deep well of a second conductive type, wherein the deep well of second conductive type is disposed on a buried layer of first conductive type, and a collector layer in contact with the base layer, the collector layer having a second doping concentration higher than the first doping concentration.

The base layer may be disposed below the drift region, and the deep well of second conductive type surrounds the base layer and is in contact with the body region.

Other features and aspects may be apparent from the following detailed description, the drawings, and the claims.

BRIEF DESCRIPTION OF THE DRAWINGS

FIG. 5 is a diagram illustrating an example of a vertical bipolar junction transistor.

FIG. 6 is a diagram illustrating an example of a vertical bipolar junction transistor.

Figure 1:
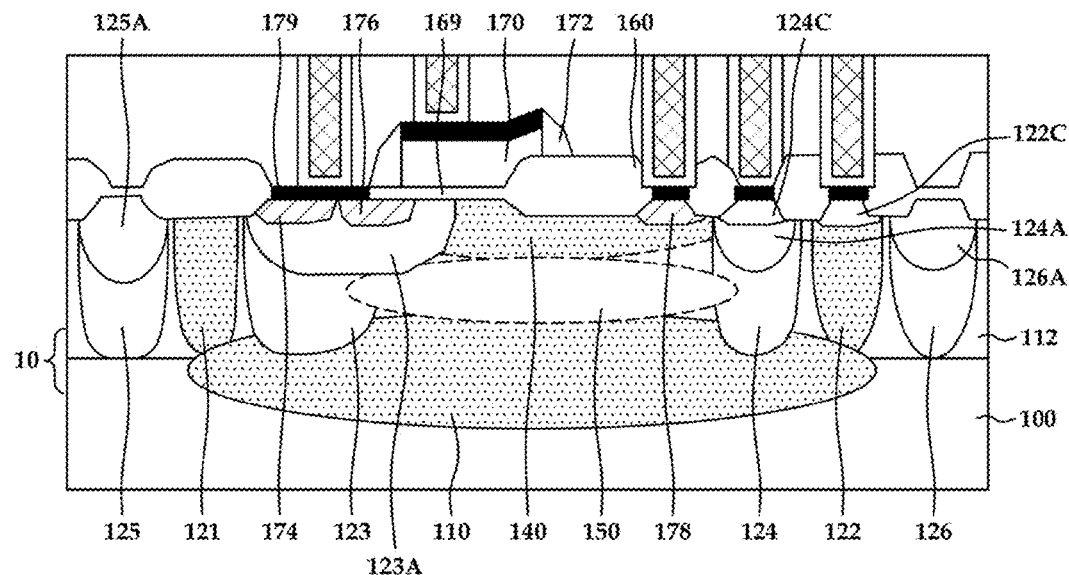
FIG. 1 is a diagram illustrating an example of a DMOS device that is formed together with a vertical bipolar junction transistor.

Throughout the drawings and the detailed description, unless otherwise described, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Various devices may be manufactured in one semiconductor substrate through a low-cost Bipolar-CMOS-DMOS process in accordance with the examples described in the following description. These devices may be devices such as, for example, nLDMOS, pLDMOS, Isolated CMOS, Bipolar Complementary Metal Oxide Semiconductor (BiCMOS), CMOS and DMOS (C/DMOS), nDMOS, pDMOS, Vertical NPN, Lateral PNP, Schottky diode. Nevertheless, for ease of explanation, a vertical bipolar junction transistor (Vertical BJT) will be mainly explained in the following description.

The nLDMOS is used in a power device such as a DC-DC high current converter. According to the example provided herein, a breakdown voltage (BVdss) of nLDMOS is maximized; Resistance of Drain-Source in the ON state (Rdson) is minimized; and the manufacturing cost is largely reduced. A vertical bipolar junction transistor having a high current gain of 100 or more is widely used in many kinds of analogue circuits such as, for example, an amplifier, a comparator, and a bandgap reference circuit. A vertical bipolar junction transistor suggested herein includes a vertical NPN BJT or a vertical PNP BJT. FIG. 1 is a diagram illustrating an example of a DMOS device that is manufactured simultaneously with a vertical bipolar junction transistor (BJT) through a low-cost BCD process. A method used to form the DMOS device of FIG. 1 and a manufacturing process thereof are used together to form an emitter region, a base region, a collector region with respect to a BJT device. There is no need to use a new mask to separately form the emitter region and the base region of the BJT device. For example, in cases of forming to be aligned with a DMOS structure in a semiconductor substrate, a drift region (140 in FIG. 2) of the vertical bipolar junction transistor is to be formed simultaneously with a drift region (140 in FIG. 1) of the DMOS structure in one semiconductor substrate, under the same process condition. The drift region (140 in FIG. 2) of the vertical bipolar junction transistor (BJT) may be the same as the doping concentration and doping profile of the drift region (140 in FIG. 1) of the DMOS structure.

Likewise, a body region of a second conductive type of the DMOS structure (123A in FIG. 1) and body regions of a second conductive type of the vertical bipolar junction transistor (123A, 124A in FIG. 2) are simultaneously disposed in one semiconductor substrate under the same process condition. All of a buried layer of a second conductive type 150, wells of a second conductive type 123, 124, wells of a first conductive type 121, 122, outer well regions of a second conductive type 125, 126, a high concentration body contact region 174, a high concentration source region 176, a high concentration drain region 178 and a gate 170, and a silicide layer 179, in the DMOS device, are simultaneously formed in the vertical bipolar junction transistor region.

By simultaneously forming a DMOS and a bipolar junction transistor by way of a low-cost BCD process, an additional process for raising the current gain of a vertical bipolar junction transistor is not needed. Accordingly, a vertical bipolar junction transistor having a high current gain can be manufactured at low-cost.

In the non-exhaustive examples P− or P+ substrate is used as a semiconductor substrate 10. But, P− or P+ substrate 100 in which a P epitaxial layer 112 is formed may be used. The P− substrate 100 is a substrate in which P-type dopants are weakly doped, and the P+ substrate 100 is a substrate in which P-type dopants are doped in a higher concentration than in P− substrate. In the present disclosure, a semiconductor substrate 10 may use a semiconductor layer 100 and an epitaxial layer 112 that is disposed on the semiconductor layer 100, or may use only a semiconductor layer 100 without an epitaxial layer. Here, P epitaxial layer may be used as a base region. For the following discussion, a first conductive type is N type and a second conductive type is P type.

The DMOS device of FIG. 1 comprises a buried layer of a first conductive type 110, a drift region of a first conductive type 140, a buried layer of a second conductive type 150, wells of a second conductive type 123, 124, wells of a first conductive type 121, 122, outer well regions of a second conductive type 125, 126, a body region of a second conductive type 123A, a high concentration body contact region 174, a high concentration source region 176, a high concentration drain region 178, a gate 170, and a silicide layer 179, in a semiconductor substrate 100. Also, a gate insulating layer 169 and a gate electrode 170 are disposed at an upper portion of the drift region 140.

The buried layer of first conductive type 110 prevents punch through between the source region 176 and the substrate 100. It also provides a low contact resistance connection to the collector electrode of vertical NPN Transistors. The high concentration body contact region of second conductive type 174 may be used as a base terminal of BJT device, which will be described below. The high concentration source region of first conductive type 176 and the high concentration drain region of first conductive type 178 may be used as an emitter terminal or a collector terminal.

A body region of a second conductive type 123A and a buried layer of a second conductive type 150 are electrically connected with each other. When the buried layer of second conductive type 150 and the body region of second conductive type 123A are connected with each other, a voltage may be applied to the buried layer of second conductive type 150 through the body region of second conductive type 123A. The body region of second conductive type (P-Body) 123A also plays a role in isolating laterally the drift region of first conductive type (N-Drift) 140 from the buried layer of first conductive type (N+BL) 110, along with the buried layer of second conductive type 150. Further, a channel region C is disposed in a silicon active region that is in the body region of second conductive type (P-Body) 123A, which is overlapped with a gate electrode.

Figure 2:
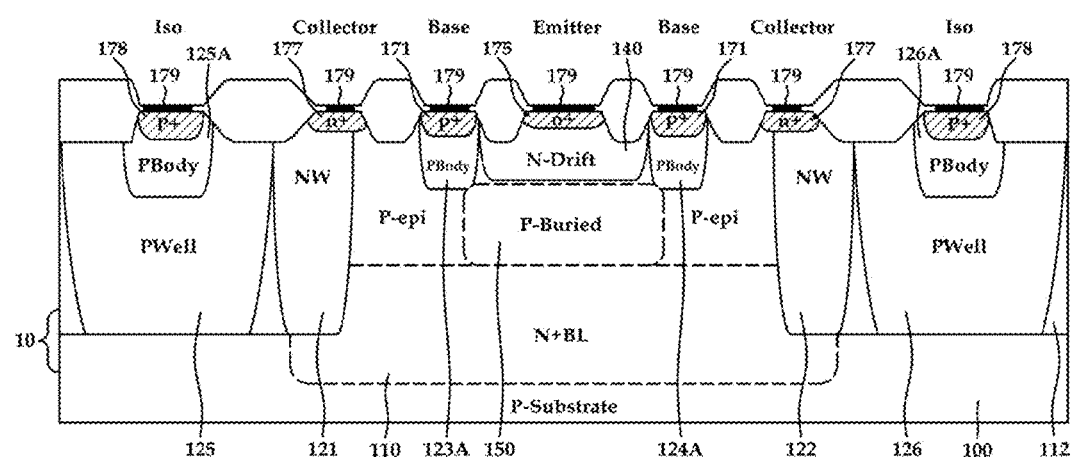
FIG. 2 is a diagram illustrating an example of a vertical bipolar junction transistor.

FIG. 2 is a diagram illustrating an example of a vertical bipolar junction transistor. An emitter terminal 175 and a collector terminal 177 which are high concentration doping regions are disposed in a semiconductor substrate 10. Between the emitter terminal 175 and the collector terminal 177, a base terminal 171 is disposed. The base terminal 171 is a high concentration doping region. A drift region 140 (N-Drift) having a first doping concentration surrounds the emitter terminal 175 and is deeper than the base terminal 171 and the collector terminal 177. The base terminal 171 is doped in P+ of a second conductive type, the emitter terminal 175 and the collector terminal 177 are doped in N+ of a first conductive type.

The terminal refers to a kind of Contact region. In the description below, N+, P+ are cases where N-type or P-type dopants are ion-implanted and doped in a high concentration to a high ion implant dose or dosage of $1E15/cm^2$ or more. N−, P− are cases where N-type or P-type dopants are ion-implanted and doped in a low concentration between $1E11$-$1E14/cm^2$. The drift region 140 corresponds thereto.

The outer wells of second conductive type 125, 126 are located at outer side of the well rings of first conductive type 121, 122 (N-Well ring). A well contact region 178 inside the outer wells of second conductive type 125, 126 is also doped in a high concentration, it is thus used as an Ohmic contact for lowering resistance of outer side well. A contact region 177 of well rings of first conductive type 121, 122 is also used as an Ohmic contact for lowering a well resistance.

A silicide layer 179 is disposed on surfaces of the base terminal of second conductive type 171, the emitter terminal of first conductive type 175, and the collector terminal of first conductive type 177. It lowers the Ohmic contact resistance between a metal wire for connection with the outside. The silicide layer 179 may comprise of material, such as, for example, titanium (Ti) or cobalt (Co). The electrode wiring process can be performed in a usual way, the detailed description thereof is thus omitted.

A drift region of a first conductive type 140 may be called an emitter layer. The drift region of first conductive type 140 may be formed by ion-implanting low-dose dopants of an N type. A doping concentration of the drift region of first conductive type 140 is lower than that of the emitter terminal of first conductive type 175. The emitter terminal of first conductive type 175 and the drift region of first conductive type 140 form an emitter region E. Accordingly, a built-in electric field is generated in an emitter due to a doping concentration difference between the drift region of first conductive type 140 and the emitter terminal of first conductive type 175 that constitute the emitter region. A drift current generated from the built-in electric field, then offsets a hole injection current that is injected from a base to an emitter.

Unlike an emitter that is only comprised of N+, in the emitter of FIG. 2, a built-in electric field, i.e., an internal electric field exists due to the doping concentration difference between the emitter terminal of N+ first conductive type 175 and the drift region of N− first conductive type 140. The drift current resultant from this electric field is such that a hole injection current that flows in the emitter that is comprised of N+ and N-Drift becomes comparatively smaller than a hole injection current that flows in the emitter that is only comprised of N+. Therefore, an emitter efficiency consisting of N+ and N-Drift is higher than an emitter efficiency consisting of only N+. A wide emitter region due to a high emitter efficiency and a drift region of a first conductive type 140 increases a maximum current gain ($\beta$max).

A base layer (P-Buried) 150 is disposed below the drift region of first conductive type (N-Drift) 140. The P-Buried 150 can be formed at the same time as the N-Drift region 140, which reduces the number of masks used for the fabrication and reduces cost. A PN junction is disposed at a boundary surface between the base layer 150 and the emitter layer 140. A horizontal length of the base layer 150 may be similar to that of the drift region 140. This is because the drift region of first conductive type (N-Drift) 140 and the base layer (P-Buried) 150 are formed using the same mask in the manufacturing process. The base layer is self-aligned with the drift region. The P-Buried 150 is referred to as a buried layer that is ion-implanted with P-type dopants, formed at the same time as the N-Drift region, and may be used as a base layer.

The buried layer of second conductive type 150 is located between the buried layer of first conductive type 110 and the drift region of first conductive type 140, and is formed by ion-implanting P-type dopants. The energy for ion implantation is designed to be 1-2 MeV, and the ion implantation quantity, i.e., dose, is designed to be $1E13$ $cm^2$ or less so as to form the buried layer of second conductive type 150 between the drift region of first conductive type 140 and the buried layer of first conductive type 110.

Body regions of a second conductive type (P-Body) 123A, 124A surround the base terminal. The base terminal is ion-implanted with high concentration P-type dopants. The body region is doped in a concentration lower than the buried layer of second conductive type 150. The base terminal of second conductive type 171, the body regions of second conductive type 123A, 124A, and the buried layer of second conductive type 150, which is a base layer, are disposed in the P-epitaxial layer 112. The base terminal of second conductive type 171, the body regions of second conductive type 123A, 124A, and the buried layer of second conductive type 150 are electrically connected with each other and form a base region B. The body region provides a conductive path from a base terminal 171 to a base layer 150. The body regions of second conductive type 123A, 124A are formed as plural. Each of the body regions of second conductive type 123A, 124A is formed to be in contact with both side portions of the drift region of first conductive type 140 and both side portions of the buried layer of second conductive type 150. Such body regions of a second conductive type 123A, 124A play a role in connecting the base terminals of second conductive type 171 with the buried layer of second conductive type 150, which is a base layer, and the surrounding sides of the emitter region. The energy for ion implantation of the body regions of second conductive type 123A, 124A, may be designed to be 20-50 KeV, and the ion implantation quantity, i.e., dose, may be designed to be equal to or more than 1E13 cm$^2$ and equal to or less than 1E14 cm$^{-2}$. After going through diffusion process, the body regions of second conductive type 123A, 124A are diffused to the drift region of first conductive type 140 and the buried layer of second conductive type 150.

A collector layer (NBL or N+BL) 110 is disposed to be in contact with the base layer 150. The collector layer 110 has a second doping concentration higher than a first doping concentration of the emitter layer (N-Drift) 140. By the manner in which the collector layer 110 is disposed below the base layer 150, a PN junction is disposed between the collector layer 110 and the base layer 150. The buried layer of first conductive type 110 that is used as a collector layer, and may be disposed at a boundary surface of the semiconductor layer 100 and the epitaxial layer 112. The reason of doping the collector layer 110 in a higher concentration than the emitter layer is to secure a resistance of the lower collector region. Antimony (Sb) of N-type dopants is ion-implanted such that a mask for forming a buried layer of a first conductive type 110 in a semiconductor substrate 100 is disposed. Phosphorus (P) may be additionally ion-implanted. An epitaxial layer 112 is formed by means of oxidation and drive-in process. In such a manner, a buried layer of a first conductive type 110, as disclosed in FIG. 2, is disposed at a boundary surface of the semiconductor layer 100 and the epitaxial layer 112. The buried layer of first conductive type 110 constitutes a collector region along with the collector terminal of first conductive type 177, and serves to lower a resistance of the collector region.

Well rings of a first conductive type (NW RING) 121, 122 are disposed to surround the collector terminal. The well rings of first conductive type 121,122 are formed to be extended to the collector layer 110. The collector terminal of first conductive type 177, the well rings of first conductive type (NW RING) 121, 122 and the buried layer of first conductive type 110, which is a collector layer, are electrically connected to form a collector region. The well rings of first conductive type (NW RING) 121, 122 provide a conductive path from the collector terminal 177 to the collector layer 110. NW RING and PW (well of second conductive type 123, 124) are formed by way of retrograde Well that is ion-implanted with N type or P type dopants.

Figure 3:
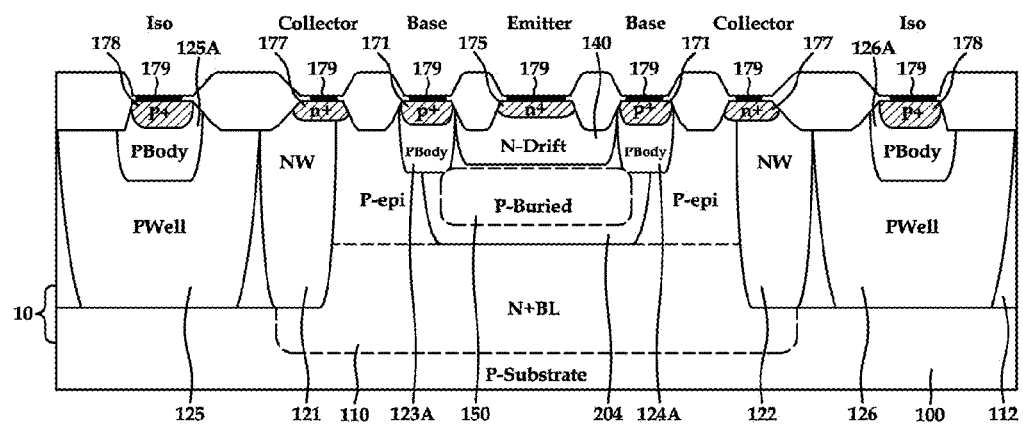
FIG. 3 is a diagram illustrating an example of a vertical bipolar junction transistor.

FIG. 3 is a diagram illustrating an example of a vertical bipolar junction transistor. Unlike the foregoing examples, FIG. 3 discloses a vertical bipolar junction transistor where a base layer comprises a buried layer of a second conductive type 150 and the body regions of second conductive type 123A, 124A. The Well of first conductive type 204 is additionally disposed on the buried layer of first conductive type 110. The additional Well of first conductive type 204 decreases the concentration of the buried layer of a second conductive type 150 due to the counter doping. On the other hand, the concentration of N-Drift increases with the additional Well of first conductive type 204. The hole injection current that is injected from a base to an emitter is reduced. Therefore, the current gain of a vertical bipolar junction transistor may increase.

The emitter terminal of first conductive type 175 and the drift region of first conductive type 140 form an emitter region. The base terminal of second conductive type 171, the body regions of second conductive type 123A, 124A, and the buried layer of second conductive type 150 form a base region. The collector terminal of first conductive type 177, the well rings of first conductive type 121, 122, and the buried layer of first conductive type 110 form a collector region. The buried layer of first conductive type 110 may be called a collector layer.

Figure 4:
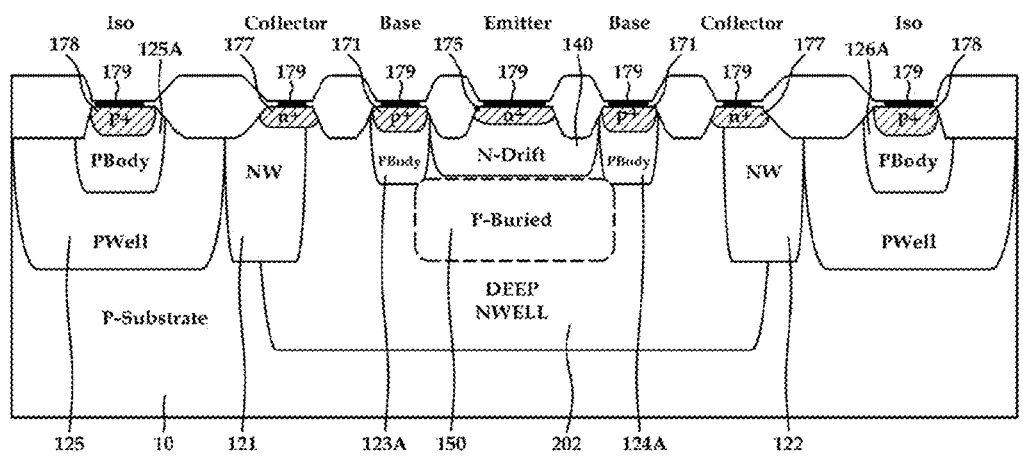
FIG. 4 is a diagram illustrating an example of a vertical bipolar junction transistor.

FIG. 4 is a diagram illustrating an example of a vertical bipolar junction transistor. Unlike the foregoing examples, FIG. 4 discloses a structure where a vertical bipolar junction transistor is formed without the P-epitaxial layer 112. Instead of the buried layer of first conductive type 110 that is used as a collector layer, a deep well of a first conductive type (Deep N-Well) 202 is used. The deep well of first conductive type, i.e., the collector layer 202 extends from a surface of the semiconductor substrate and surrounds the sides and bottom surfaces of the buried layer of second conductive type 150, which is the base layer, the drift region 140 and the body regions 123A, 124A. Further, the deep well of first conductive type 202 is formed to be extended to the well rings of the first conductive type (N-Well RING) 121,122. The collector layer comprised of the deep well of first conductive type (Deep N-Well) 202 has a very wide extent thereby allowing an electrical current to flow more smoothly from the base region to the collector region. The deep well of first conductive type (Deep Well) 202 is formed by the same process as in the process of forming the retrograde Well of CMOS device. The deep well of first conductive type (Deep N-Well) 202 may also be identified as a Retrograde Well, and may be referred to as a structure in which the energy and the ion implantation concentration are implanted three times or more at each different step, resulting in a higher concentration deeper into the silicon substrate.

The emitter terminal of first conductive type 175 and the drift region of first conductive type 140 form an emitter region. The base terminal of second conductive type 171, the body regions of second conductive type 123A, 124A and the buried layer of second conductive type 150 form a base region. The collector terminal of first conductive type 177, the well rings of first conductive type 121, 122 and the deep well of first conductive type 202 form a collector region.

FIG. 5 is a diagram illustrating an example of a vertical bipolar junction transistor. Wells of a second conductive type 123, 124 formed to be in contact with the base layer 150, the body regions 123A, 124A, and the collector layer 110. The wells of second conductive type 123, 124 may be formed as plural. The wells of second conductive type 123, 124 are formed to be spaced apart from each other with a certain interval. A concentration of the wells of second conductive type 123,124 is lower than that of the body regions 123A, 124A because the wells of second conductive type 123,124 undergo a high temperature annealing for a long time to be diffused to the semiconductor layer 100. That is why the wells of second conductive type 123, 124 are formed to be in contact with both sides of the buried layer of second conductive type 150 and are formed from a surface of the epitaxial layer 112 to the buried layer of first conductive type 110.

The well region of second conductive type 123 plays a role in connecting the body regions of second conductive type (P-body) 123A, 124A and the buried layer of second conductive type (PBL) 150 so that they are not to be detached from each other. The body regions of second conductive type (P-body) 123A, 124A and the buried layer of second conductive type (PBL) 150 are attached with each other. If detached from each other, they become floating and are unable to function. The emitter terminal of first conductive type 175 and the drift region of first conductive type 140 form an emitter region. The base terminal of second conductive type 171, the body regions of second conductive type 123A, 124A, the buried layer of second conductive type 150 and the wells of second conductive type 123,124 form a base region. The collector terminal of first conductive type 177, the well rings of first conductive type 121, 122 and the buried layer of first conductive type 110 form a collector region.

FIG. 6 is a diagram illustrating an example of a vertical bipolar junction transistor. Referring to FIG. 6, unlike the foregoing examples, instead of the buried layer of second conductive type 150 that is used as a base layer, a deep well of a second conductive type (Deep P-Well) 120 is used as a base layer. The base layer 120 extends from a surface of the semiconductor, and surrounds sides and bottom surface of the drift region 140. The base layer (deep well of second conductive type Deep P-Well) 120 surrounds a bottom surface of the body regions of second conductive type 123A, 124A. The deep well of second conductive type 120 forms a base region along with the body regions of second conductive type 123A, 124A. Due to the deep well of second conductive type 120, which is formed to be wide, the electricity current may be smooth between the base region and the collector region.

The wells of second conductive type 123, 124 are optional, thus it may be used or may not be used. In cases of using the wells of second conductive type 123,124, the region overlapped with the deep well of second conductive type 120 may lower a resistance as its concentration is formed to be higher than that of other regions (center region).

The emitter terminal of first conductive type 175 and the drift region of first conductive type 140 form an emitter region. The base terminal of second conductive type 171, the body regions of second conductive type 123A, 124A and the base layer 120 form a base region. The collector terminal of first conductive type 177 and the buried layer of a first conductive type 110 form a collector region.

Figure 7:
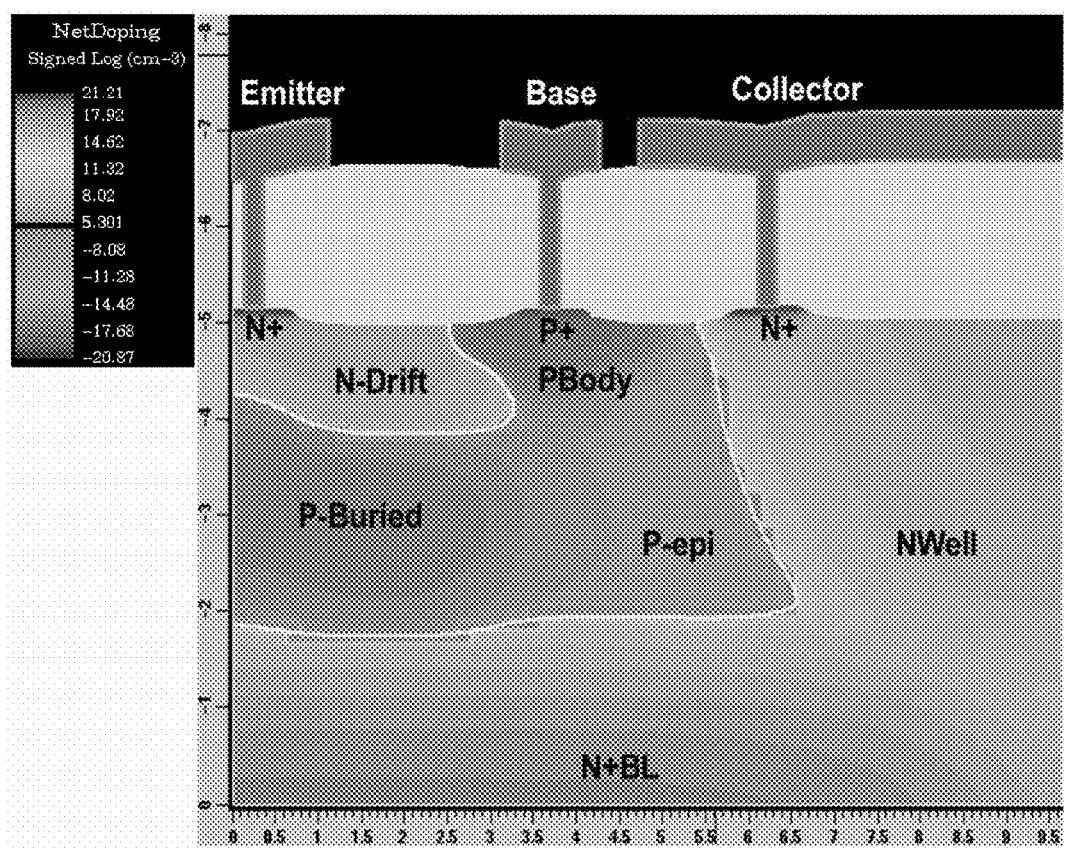
FIG. 7 is a diagram illustrating an example of a device simulation result of a vertical bipolar junction transistor.

FIG. 7 is a diagram illustrating an example of a device simulation result of a vertical bipolar junction transistor, in which an emitter region, a base region, a collector region are formed. In FIG. 7, N+ and N-Drift form an emitter region. Also, P+, P-Body, P-Buried, P-epi layer form a base region. Further, N+, N-Well, N+BL layer form a collector region.

Figure 8:
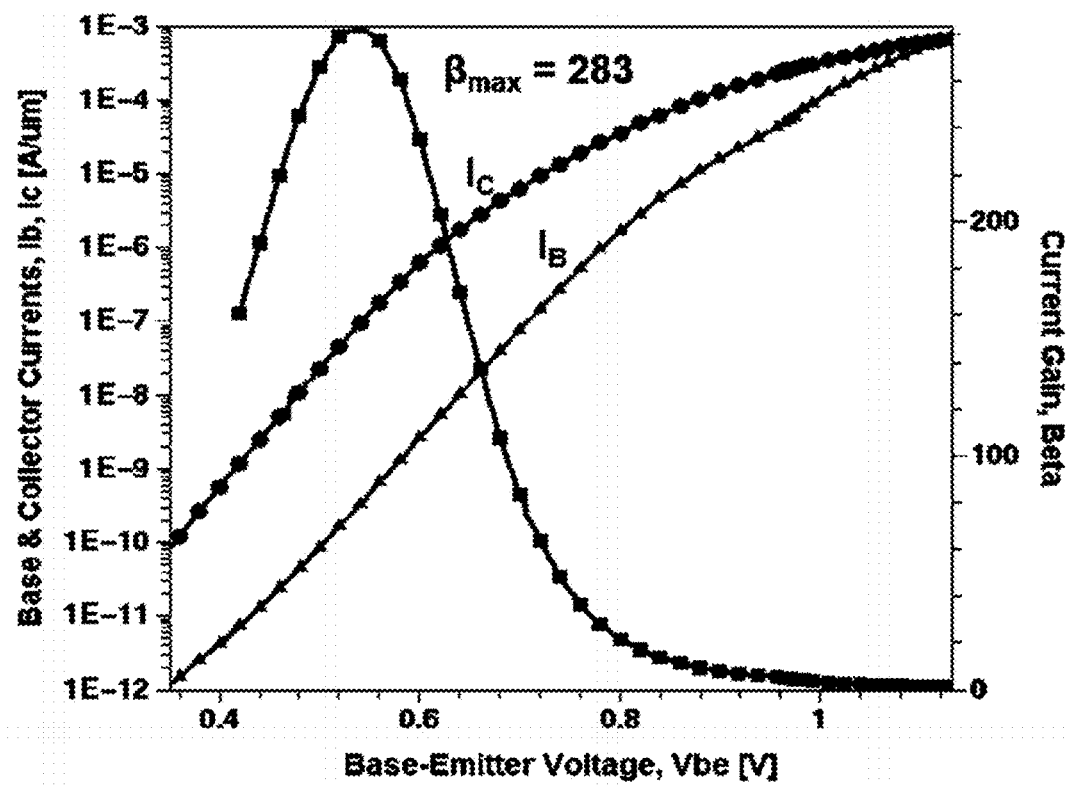
FIG. 8 is a diagram illustrating an example of a current gain of a vertical bipolar junction transistor.

In FIG. 8 is a diagram illustrating an example of a current gain measured value of a vertical bipolar junction transistor. A horizontal axis represents a base-emitter voltage (Vbe). A vertical axis represents a base current (Ib), a collector current (Ic) and a current gain (β). The current gain is defined by dividing the collector current (Ic) by the base current (Ib). According to the first example, when the base-emitter voltage (Vbe) is in the range of 0.4 V to 0.7 V, the current gain (β) is 100 or more, the maximum current gain (βmax) is approximately 283.

According to an aspect a vertical bipolar junction transistor and a manufacturing method of the same is provided. The vertical bipolar junction transistor can lower the manufacturing cost of the bipolar junction transistor and that can elevate the current gain at the same time by use of a BCD process.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

100: semiconductor substrate
110: collector layer, buried layer of first conductive type (N-Buried Layer, N+BL or NBL)
112: epi-layer
120: deep well of second conductive type (Deep P-well)
121, 122: well ring of first conductive type (NW RING)
123, 124: well of second conductive type (PW)
123A, 124A, 125A, 126A: body region of second conductive type (P-Body)
125, 126: outer well of second conductive type
140: drift region of first conductive type (N-Drift)
150: base layer, buried layer of second conductive type (P-Buried Layer, PBL)
160: field oxide layer or STI oxide layer
171: base terminal of second conductive type
175: emitter terminal of first conductive type
177: collector terminal of first conductive type
179: silicide layer
169 gate insulating layer
170, 170A, 170B, 170C, 170D: gate electrode
172, 172A, 172B, 172C: spacer
174: high concentration body contact region
176: high concentration source region
178: high concentration drain region
123C, 124C: high concentration source region of first conductive type or high concentration drain region of first conductive type
122C, 125C, 126C: high concentration source and drain region of first conductive type
201: Deep Well of a second conductive type
204: Well of first conductive type (NW)

What is claimed is:
1. A vertical bipolar junction transistor comprising:
a highly doped emitter region having a first conductivity type disposed on a semiconductor substrate;
a pair of highly doped collector regions, having the first conductivity type, symmetrically disposed on the semiconductor substrate with respect to the emitter region;
a pair of highly doped base regions, having a second conductivity type opposite to the first conductivity type, symmetrically disposed with respect to the emitter region, each base region being disposed between the emitter region and one of the collector regions;

a drift region having a first doping concentration surrounding the emitter region and being deeper than either the base region or the collector region, the drift region having the first conductivity type;

a base layer, having the second conductivity type, disposed below the drift region; and a collector layer in contact with the base layer, the collector layer having a second doping concentration higher than the first doping concentration, the collector layer having the first conductivity type;

wherein a field oxide layer defining an isolation layer is disposed between the emitter, collector, and base regions, and wherein the isolation layer is deeper than either the base region or the collector region.

2. The vertical bipolar junction transistor of claim 1, further comprising:
   a body region, having the second conductive type, surrounding the base region, the body region contacting the base layer; and
   a well ring of the first conductive type spaced apart from the body region by the field oxide layer, and the well ring surrounding the collector region and extending to the collector layer.

3. The vertical bipolar junction transistor of claim 2, further comprising a well of the second conductive type disposed between the body region and the well ring.

4. The vertical bipolar junction transistor of claim 2, further comprising a well of the first conductive type disposed below the body region and the base layer.

5. The vertical bipolar junction transistor of claim 2, wherein:
   the base region, the body region and the base layer form a base region; and
   the collector region, the well ring of first conductive type, and the buried layer of first conductive type form a collector region.

6. The vertical bipolar junction transistor of claim 1, wherein the base layer is self-aligned with the drift region.

7. The vertical bipolar junction transistor of claim 1, wherein the base layer comprises a first buried layer of the second conductive type and the collector layer comprises a second buried layer of the first conductive type, such that the second buried layer and the first buried layer form a collector-base junction.

8. The vertical bipolar junction transistor of claim 1, further comprising an epitaxial layer having the second conductive type disposed on the semiconductor substrate, such that the base layer and the drift region are disposed in the epitaxial layer.

9. The vertical bipolar junction transistor of claim 8, wherein the collector layer is disposed at a boundary surface of the semiconductor substrate and the epitaxial layer.

10. The vertical bipolar junction transistor of claim 1, wherein a current gain ($\beta$) is equal to or more than 100 when a base-emitter voltage (Vbe) is between 0.4 V-0.7 V.

11. The vertical bipolar junction transistor of claim 1, wherein the collector layer comprises a deep well of the first conductive type extending from a surface of the semiconductor substrate and surrounding the base layer.

12. The vertical bipolar junction transistor of claim 1, wherein the base layer comprises a deep well of the second conductive type extending from a surface of the semiconductor substrate and surrounding the drift region.

13. The vertical bipolar junction transistor of claim 1, wherein the vertical bipolar junction transistor defines a drift region of a Bipolar-Complementary Metal Oxide Semiconductor (CMOS)-Double Diffused Metal Oxide Semiconductor (DMOS) (BCD) structure.

14. The vertical bipolar junction transistor of claim 13, wherein the drift region of the vertical BJT has substantially same depth as the drift region of DMOS structure.

15. A manufacturing method of a vertical bipolar junction transistor (BJT) and a Double Diffused Metal Oxide Semiconductor (DMOS) structure, comprising:
   simultaneously performing at least the two following steps:
      forming a drift region of the DMOS structure; and
      forming a drift region of the vertical BJT,
   wherein the drift region of the vertical BJT is formed spaced apart from the drift region of DMOS structure, and
   wherein the method for forming the vertical BJT further comprises;
      forming a collector layer on a semiconductor substrate;
      forming a base layer in contact with the collector layer;
      forming a highly doped emitter region having a first conductivity type and a highly doped collector region having the first conductivity type;
      forming a highly doped base region having a second conductivity type between the emitter region and the collector region,
   wherein the base layer is self-aligned with the drift region, and
   wherein the drift region of the vertical BJT has a first doping concentration that surrounds the emitter region and is deeper than either the base region or the collector region, and the collector layer has a second doping concentration higher than the first doping concentration.

16. The manufacturing method of claim 15, wherein the drift region of the vertical BJT has the same doping profile as the drift region of the DMOS structure.

17. The manufacturing method of claim 15, wherein the drift region of the vertical BJT has substantially same depth as the drift region of DMOS structure.

18. The manufacturing method of claim 15, wherein the DMOS structure is formed in a first region and the vertical BJT is formed in a second region, and the first region is different from the second region.

19. The manufacturing method of claim 15, wherein the drift region of the DMOS structure and the drift region of the vertical BJT are of a single conductivity type.

20. A vertical bipolar junction transistor comprising:
   a highly doped emitter region, having a first conductivity type, disposed on a semiconductor substrate;
   a pair of highly doped collector regions, having the first conductivity type, symmetrically disposed on a semiconductor substrate with respect to the emitter region;
   a pair of highly doped base regions, having a second conductivity type opposite to the first conductivity type, symmetrically disposed with respect to the emitter region, each base region being disposed between the emitter region and one of the collector regions;
   a drift region, having the first conductivity type, surrounding the emitter region and being deeper than either the base region or the collector region;
   a first buried layer of the second conductive type disposed below the drift region;
   a second buried layer of the first conductive type disposed below the first buried layer;

a pair of outer wells of the second conductive type symmetrically disposed with respect to the emitter region; and a field oxide layer defining an isolation layer being disposed between the emitter, collector, and base regions, and wherein the isolation layer is deeper than either the base region or the collector region.

21. The vertical bipolar junction transistor of claim 20, further comprising a pair of body region of second conductive type connecting the base regions with the first buried layer; and a pair of well region of first conductive type connecting the collector region with the second buried layer; and wherein the well region is spaced apart from the body region by the field oxide layer.

* * * * *